United States Patent
He et al.

(10) Patent No.: US 11,792,957 B2
(45) Date of Patent: Oct. 17, 2023

(54) SYSTEM FOR COOLING OF COMPUTING COMPONENTS OF AN INFORMATION HANDLING SYSTEM

(71) Applicant: Dell Products L.P., Round Rock, TX (US)

(72) Inventors: Qinghong He, Austin, TX (US); David Grunow, Round Rock, TX (US); Michael Kotson, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 183 days.

(21) Appl. No.: 17/444,770

(22) Filed: Aug. 10, 2021

(65) Prior Publication Data
US 2023/0046922 A1 Feb. 16, 2023

(51) Int. Cl.
*H05K 7/20* (2006.01)
*G06F 1/20* (2006.01)

(52) U.S. Cl.
CPC ............. *H05K 7/2039* (2013.01); *G06F 1/20* (2013.01); *G06F 1/203* (2013.01)

(58) Field of Classification Search
CPC .... H05K 1/0203; H05K 1/141; H05K 3/0061; H05K 7/2039; H05K 2201/1056; H05K 7/20509; H05K 7/1487; H05K 1/181; H05K 1/144; G06F 1/20; G06F 1/203; G06F 1/185
See application file for complete search history.

(56) References Cited

U.S. PATENT DOCUMENTS

| | | | | |
|---|---|---|---|---|
| 8,873,240 B2 * | 10/2014 | Jimenez, III | ............ | G06F 1/185 361/730 |
| 2010/0073881 A1 * | 3/2010 | Williams | ............ | H01L 23/3672 361/704 |
| 2013/0135813 A1 * | 5/2013 | Jimenez, III | ............ | G06F 1/185 248/220.21 |
| 2014/0153192 A1 * | 6/2014 | Neer | ................... | G02B 6/4277 361/704 |
| 2016/0174415 A1 * | 6/2016 | Ito | ........................ | G02B 6/4269 361/715 |
| 2019/0163245 A1 * | 5/2019 | Kho | ......................... | G06F 1/20 |
| 2020/0301488 A1 * | 9/2020 | Dallaserra | ............... | G06F 1/206 |
| 2020/0375064 A1 * | 11/2020 | Chen | .................. | H05K 7/20172 |

* cited by examiner

*Primary Examiner* — Adam B Dravininkas
(74) *Attorney, Agent, or Firm* — McDermott Will & Emery LLP

(57) ABSTRACT

A system for cooling of computing components of an information handling system. The information handling system can include a computing card that is coupled to a computing card connector. The computing card connector can include mounting features for coupling of a thermal plate.

9 Claims, 11 Drawing Sheets

FIG. 7B

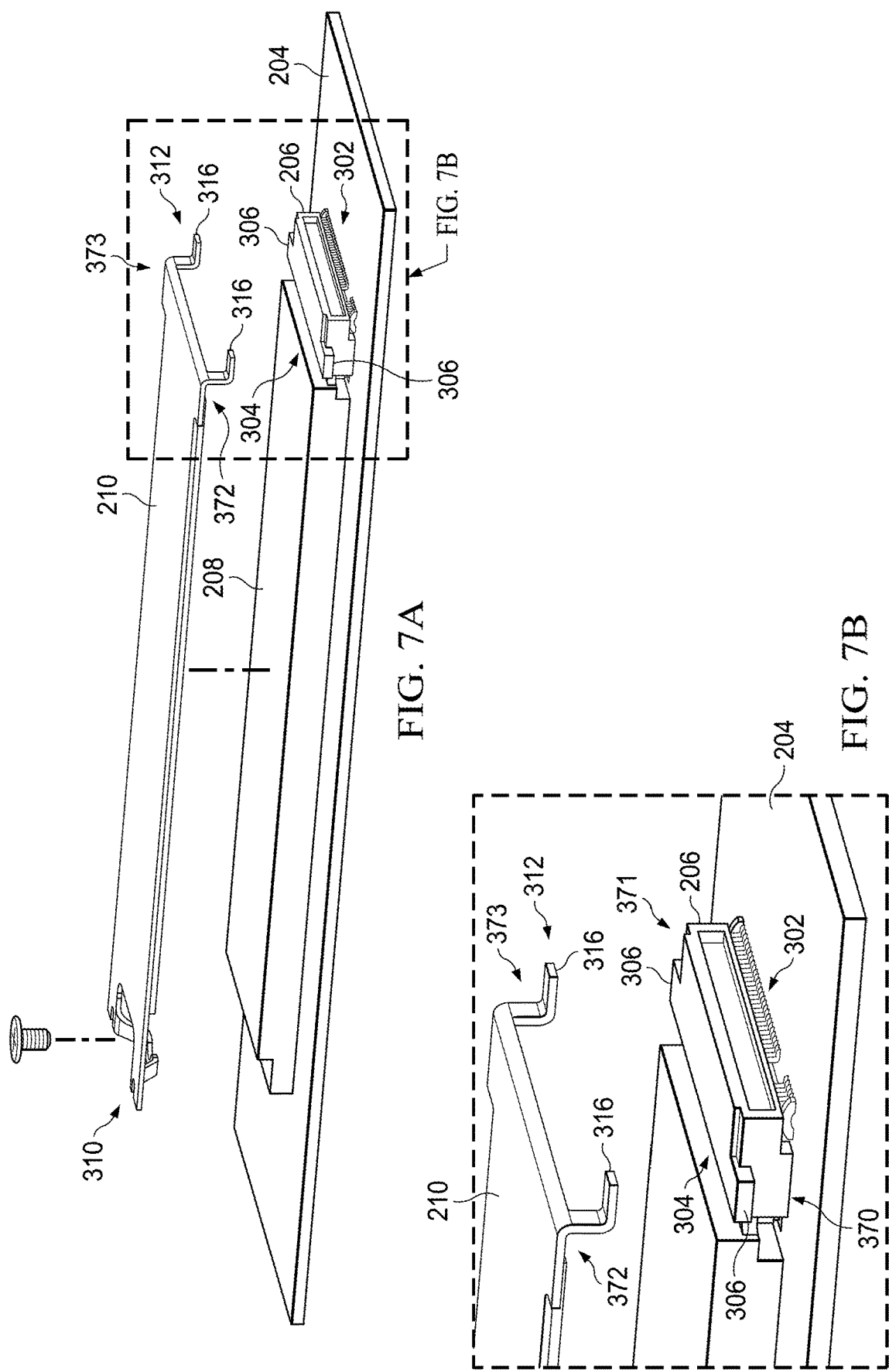

SYSTEM FOR COOLING OF COMPUTING COMPONENTS OF AN INFORMATION HANDLING SYSTEM

BACKGROUND

Field of the Disclosure

The disclosure relates generally to an information handling system, and in particular, a system for cooling of computing components of an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Copper heat spreaders have been used in information handling systems for thermal control. However, unique SSD thermal solutions are needed for most layouts, and existing heat spreads can consume board space by screw mounts and/or additional mechanical parts for mounting.

SUMMARY

Innovative aspects of the subject matter described in this specification may be embodied in a system for cooling of computing components of an information handling system, including: a printed circuit board (PCB); a computing card connector coupled to the PCB, the computing card connector including first mating features; a computing card coupled to the computing card connector; and a thermal plate including a first end and a second end positioned opposite to the first end, the second end including second mating features that correspond to the first mating features of the computing card connector, wherein the thermal plate is coupled to the computing card connector at the second end of the thermal plate such that the second mating features of the thermal plate are mated with the first mating features of the computing card connector.

Other embodiments of these aspects include corresponding systems and apparatus.

These and other embodiments may each optionally include one or more of the following features. For instance, the computing card connector is a M.2 connector, and the computing card is a M.2 computing card. The thermal plate is coupled to the computing card and the PCB at the first end of the thermal plate. The computing card connector includes a first end positioned opposite to a second end, wherein the computing card is coupled to the second end of the computing card connector. The first mating features of the computing card connector includes a recess, and the second mating features of the thermal plate includes hooking features. The thermal plate is coupled to the computing card connector such that the hooking features of the thermal plate are latched into the recess of the computing card connector. The first mating features of the computing card connector includes a mounting slot, and the second mating features of the thermal plate includes a tabbed feature. The thermal plate is coupled to the computing card connector such that the tabbed feature of the thermal plate is inserted into the mounting slot of the computing card connector. The first mating features of the computing card connector includes a mounting flange, and the second mating features of the thermal plate includes a toe-in bend feature. The thermal plate is coupled to the computing card connector such that the toe-in bend feature of the thermal plate is engaged with the mounting flange of the computing card connector. The first mating features includes a ground pass feature to provide a path to ground for the thermal plate when the thermal plate is coupled to the computing card connector.

Particular implementations of the subject matter described in this specification can be implemented so as to realize one or more of the following advantages. For example, a heat spreader plate can be independent of a system board layout. Additional board space can be reclaimed by eliminating additional mechanical parts.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 7A illustrates an exploded perspective view of cooling components of the information handling system, in a third implementation.

FIG. 7B illustrates a detailed view of mating features between components of the information handling system of FIG. 7A, in the third implementation.

DESCRIPTION OF PARTICULAR EMBODIMENT(S)

Figure 1:
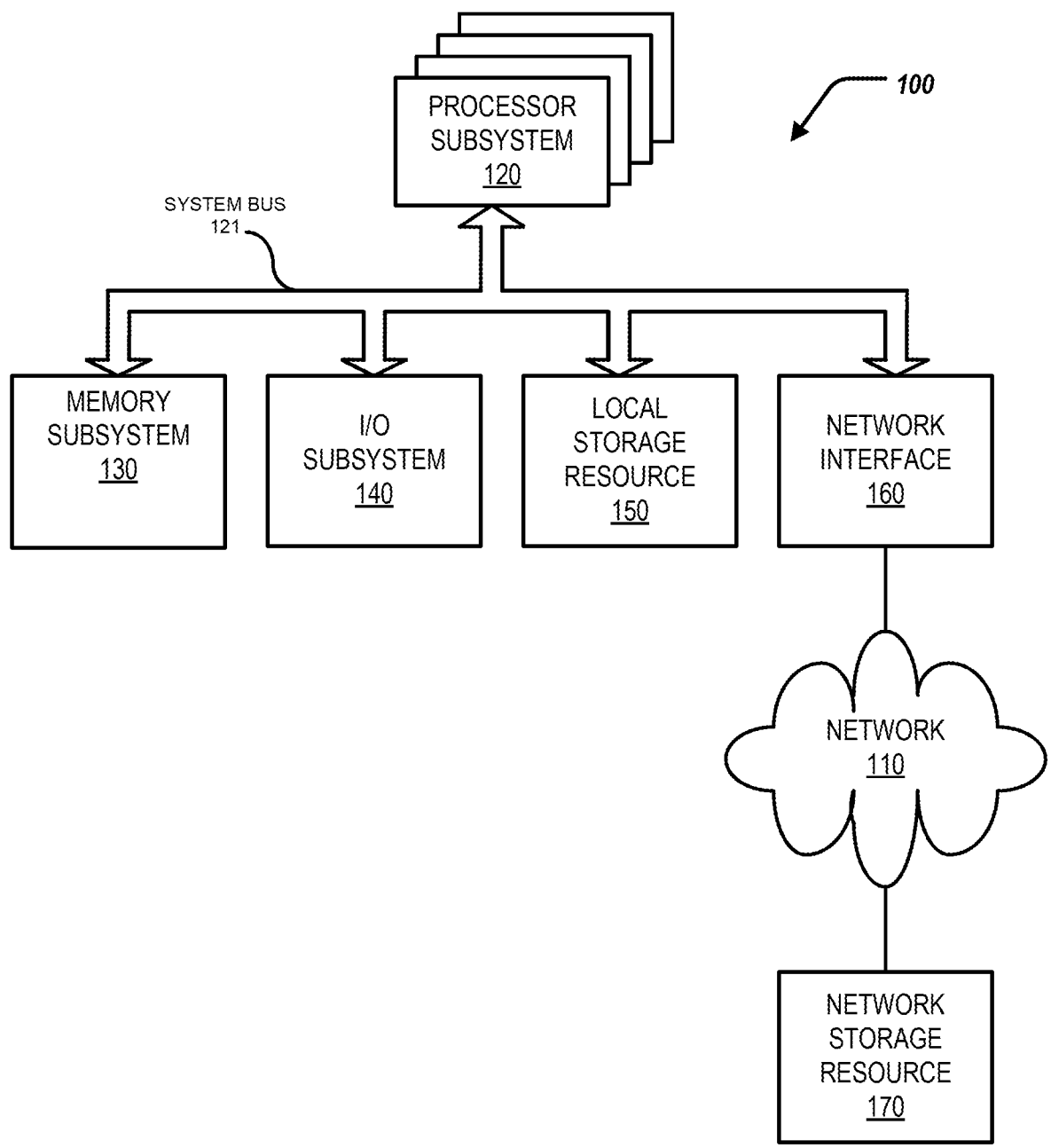
FIG. 1 is a block diagram of selected elements of an embodiment of an information handling system.

This disclosure discusses a cooling system for components of an information handling system. The information handling system can include a computing card that is coupled to a computing card connector. The computing card connector can include mounting features for coupling of a thermal plate.

Specifically, this disclosure discusses a system including a printed circuit board (PCB); a computing card connector coupled to the PCB, the computing card connector including first mating features; a computing card coupled to the computing card connector; and a thermal plate including a first end and a second end positioned opposite to the first end, the second end including second mating features that correspond to the first mating features of the computing card connector, wherein the thermal plate is coupled to the computing card connector at the second end of the thermal plate such that the second mating features of the thermal plate are mated with the first mating features of the computing card connector.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-8 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
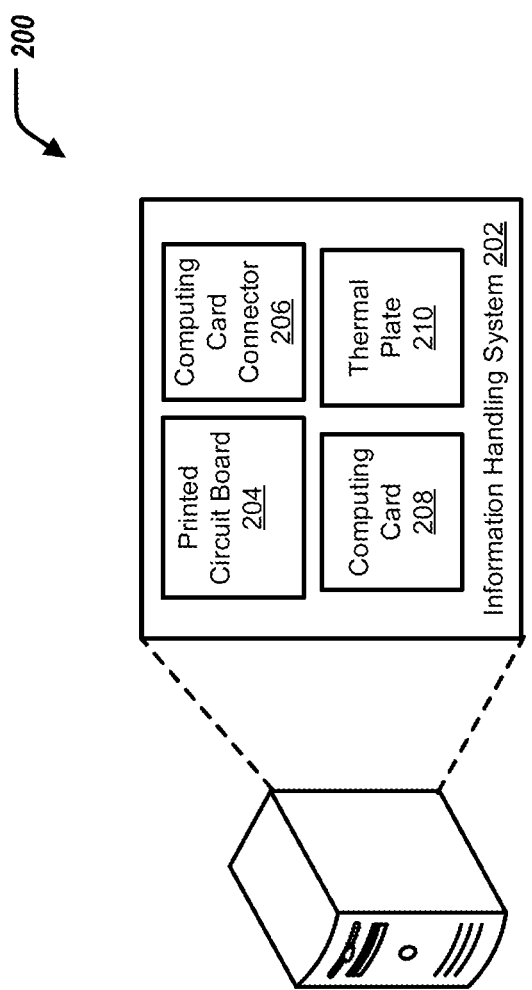
FIG. 2 illustrates a block diagram of an information handling system.

Turning to FIG. 2, FIG. 2 illustrates an environment 200 including an information handling system 202. The information handling system 202 can include a printed circuit board (PCB) 204, a computing card connector 206, a computing card 208, and a thermal plate (thermal transfer device) 210. In some examples, the information handling system 202 is similar to, or includes, the information handling system 100 of FIG. 1.

The PCB 204 can be any type of computing board, including a motherboard. The computing card connector 206 can be any type of computing card connector, including a M.2 computing card connector. The computing card 208 can be any type of computing card, including any type of computing card that includes a M.2 interface.

In short, the computing card connector 206 can include mounting features for coupling of the thermal plate 210.

Figure 3A:
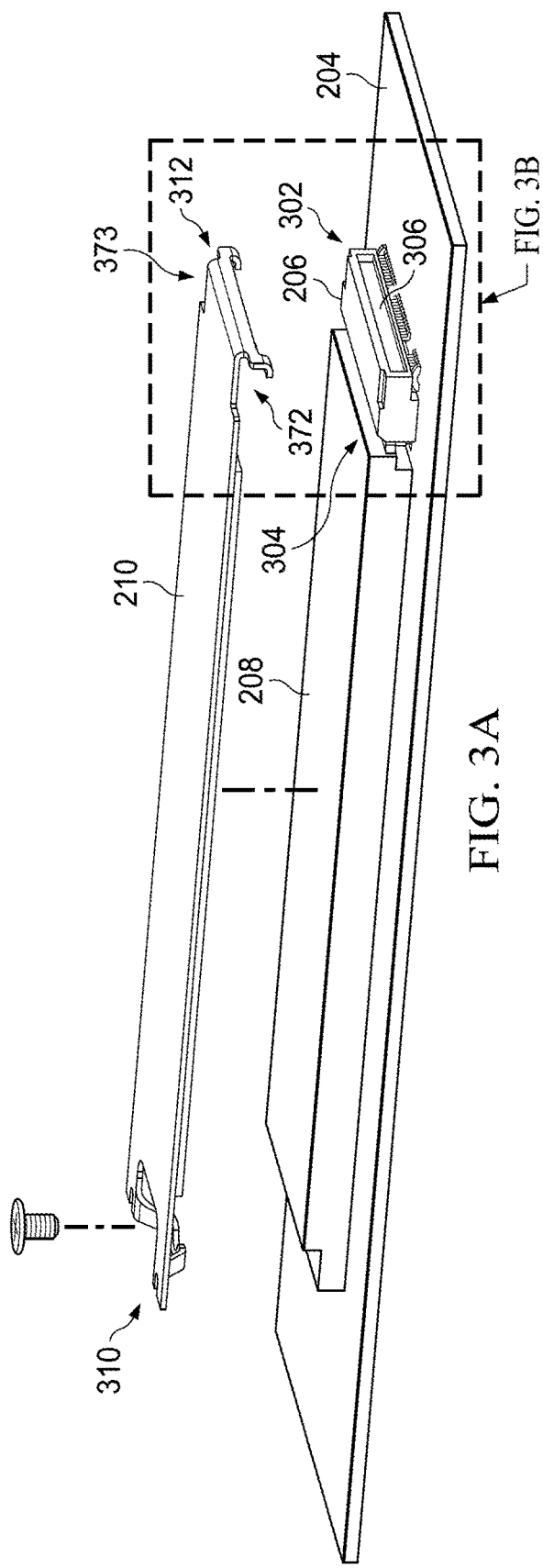
FIG. 3A illustrates an exploded perspective view of cooling components of the information handling system, in a first implementation.
Figure 3B:
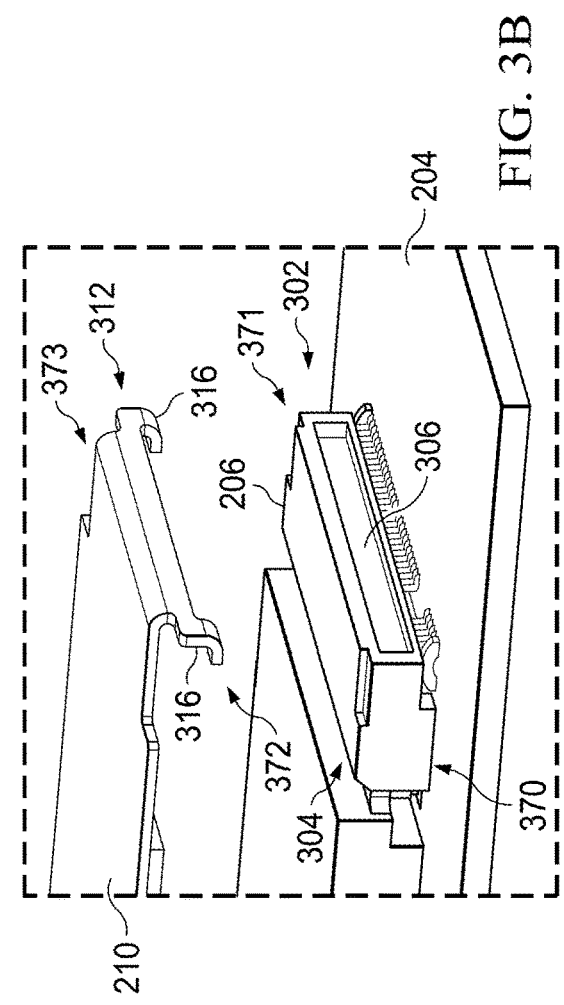
FIG. 3B illustrates a detailed view of mating features between components of the information handling system of FIG. 3A, in the first implementation.
Figure 4A:
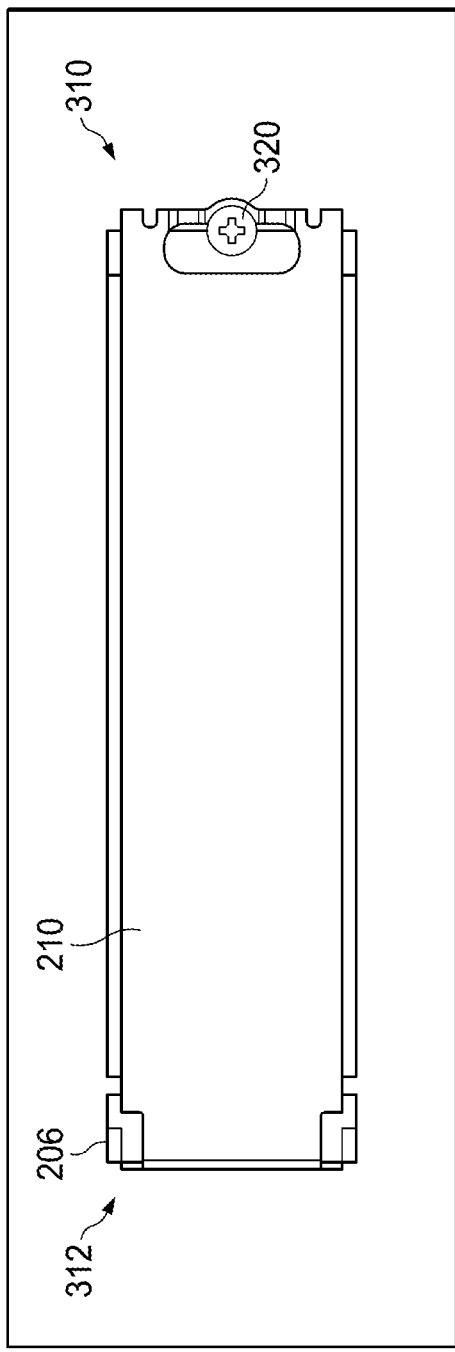
FIG. 4A illustrates a top down view of the cooling system components in an assembled state, in the first implementation.
Figure 4B:
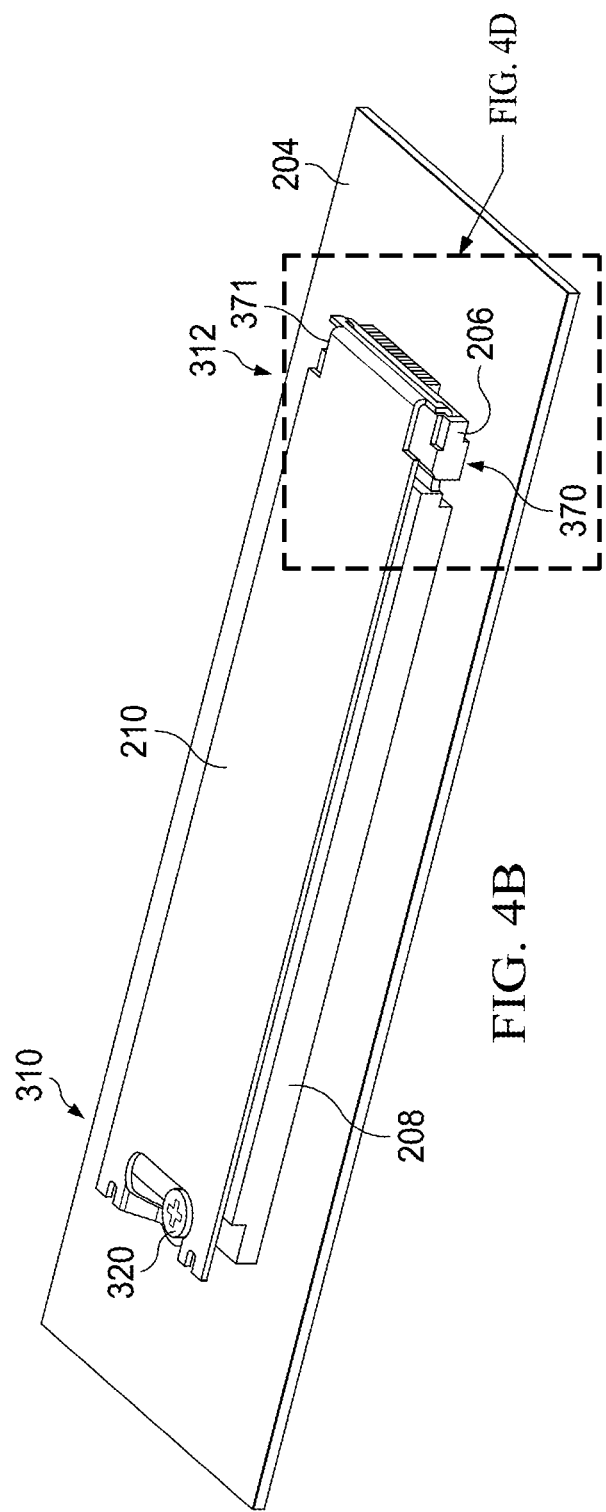
FIG. 4B illustrates a perspective view of the cooling system components in an assembled state, in the first implementation.
Figure 4C:
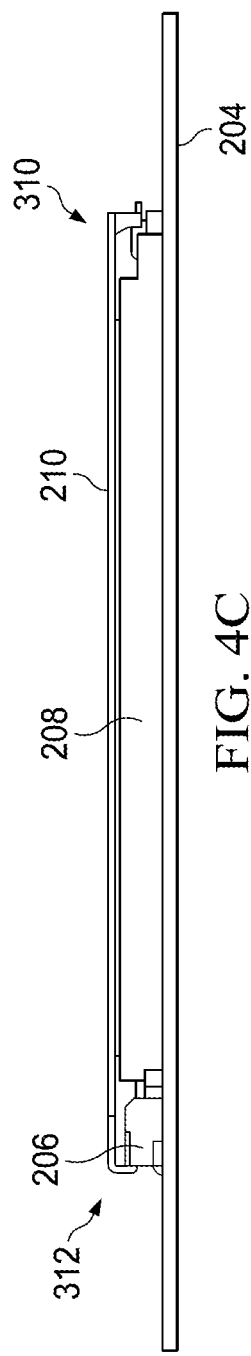
FIG. 4C illustrates a side view of the cooling system components in an assembled state, in the first implementation.
Figure 4D:
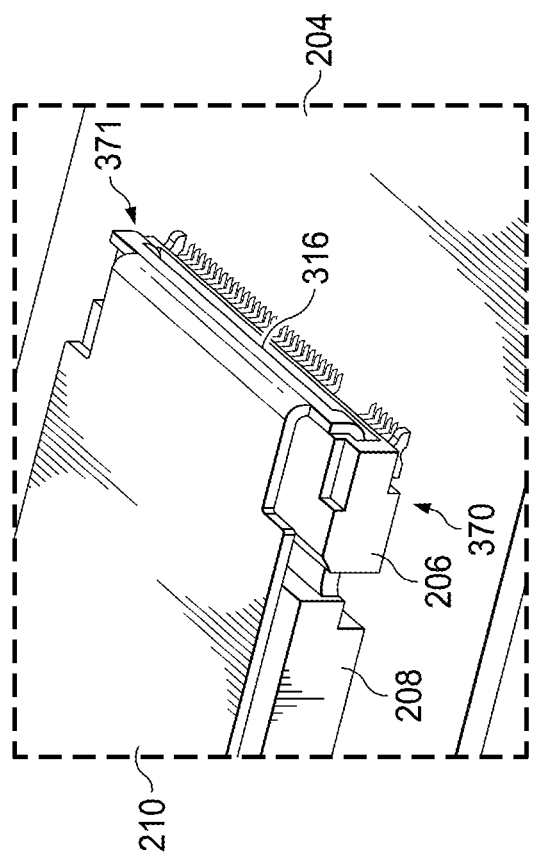
FIG. 4D illustrates a detailed view of the mating features between components of FIG. 4B in an assembled state, in the first implementation.

FIGS. 3A, 3B illustrates exploded perspective views of components of the information handling system 202, in a first implementation. Specifically, the computing card connector 206 can be coupled to the PCB 204. The computing card connector 206 can include a first end 302 and a second end 304 positioned opposite to the first end 302. The computing card connector 206 can include first mating features 306 positioned at the first end 302 of the computing card connector 206.

The computing card 208 can be coupled to the computing card connector 206. Specifically, the computing card 208 can be coupled to the computing card connector 206 at the second end 304 of the computing card connector 206.

The thermal plate 210 can include a first end 310 and a second end 312 positioned opposite to the first end 310. The second end 312 of the thermal plate 210 can include second mating features 316. The second mating features 316 of the thermal plate 210 correspond to the first mating features 306 of the computing card connector 206.

FIGS. 4A-4D illustrate the components of the information handling system 202 in an assembled state, in the first implementation. Specifically, the thermal plate 210 is coupled to the computing card connector 206 at the second end 312 of the thermal plate 210 such that the second mating features 316 of the thermal plate 210 (shown in FIGS. 3A, 3B) are mated with the first mating features 306 of the computing card connector 206 (shown in FIGS. 3A, 3B).

Specifically, when the second mating features 316 of the thermal plate 210 are mated with the first mating features 306 of the computing card connector 206, the thermal plate 210 is coupled with the computing card connector 206. In the example of FIGS. 3 and 4, the first mating features 306 of the computing card connector 206 can include a recess (or multiple recesses). In some examples, the recess can extend the length of the computing card connector 206 between a first side 370 and a second side 371 of the computing card connector 206. In some examples, the recess can extend a portion of the length of the computing card connector 206 between the first side 370 and the second side 371 of the computing card connector 206. In some examples, the computing card connector 206 can include multiple recesses. In some examples, each of the recesses of the first mating features 306 can have differing depths. The recess can be positioned opposite to that of the second end 304 of the computing card connector 206, and opposite to that of the coupling between the computing card 208 and the computing card connector 206.

The second mating features 316 of the thermal plate 210 can include hooking features (one or more hooking features). In some examples, the hooking features are positioned along a first side 372 and a second side 373 of the thermal plate 210. In some examples, the hooking features can be positioned along any portion of the second end 312 of the thermal plate 210. In some examples, the thermal plate 210 can include any number of hooking features.

Thus, when the second mating features 316 of the thermal plate 210 are mated with the first mating features 306 of the computing card connector 206, the hooking features of the thermal plate 210 are latched into the recess of the computing card connector 206. In some examples, the positioning of the second mating features 316 of the thermal plate 210 are aligned with the first mating features 306 of the computing card connector 206 when the second mating features 316 of the thermal plate 210 are mated with the first mating features 306 of the computing card connector 206. In some examples, the depth of the recesses of the computing card connector 206 can match a depth of the hooking features of the thermal plate 210 such that the hooking features of the thermal plate 210 are "secure" or appropriately coupled with the recess (or recesses) of the computing card connector 206.

In some examples, the thermal plate 210 is further coupled to the computing card 208 and the PCB 204 at the first end 310 of the thermal plate 210. Specifically, a fastener 320 can be positioned through the thermal plate 210 and/or the computing card 208 to couple the thermal plate 210 with the PCB 204.

Figure 5A:
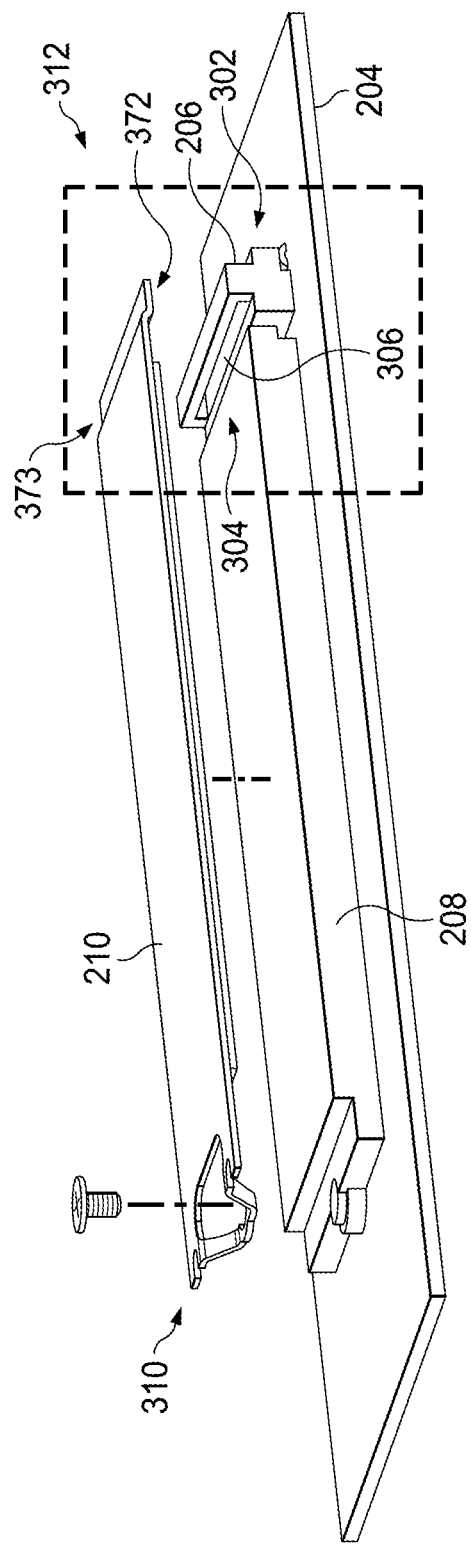
FIG. 5A illustrates an exploded perspective view of cooling components of the information handling system, in a second implementation.
Figure 5B:
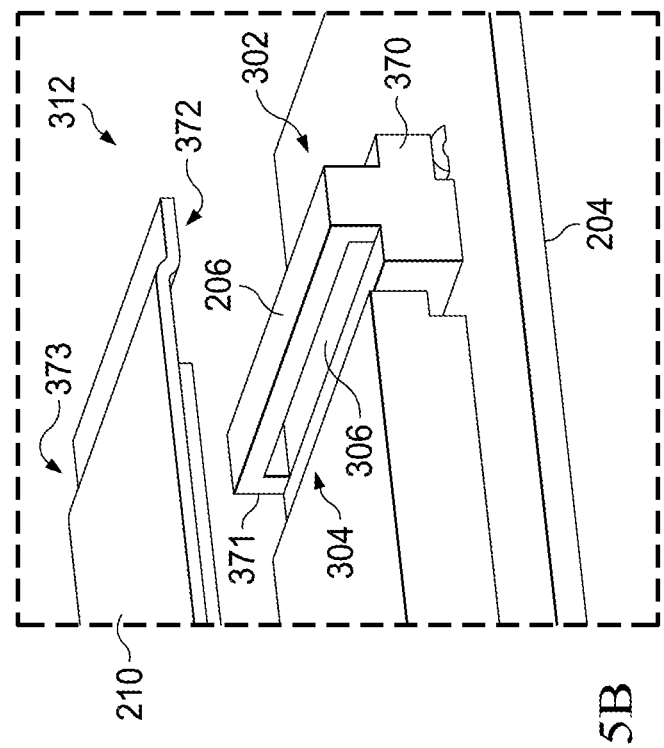
FIG. 5B illustrates a detailed view of mating features between components of the information handling system of FIG. 5A, in the second implementation.
Figure 6A:
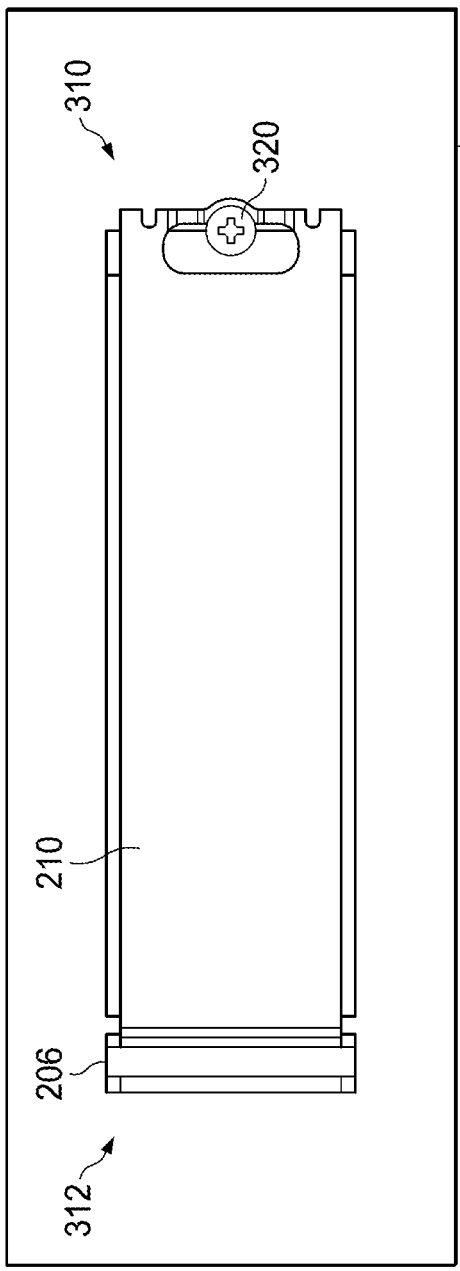
FIG. 6A illustrates a top down view of the cooling system components in an assembled state, in the second implementation.
Figure 6B:
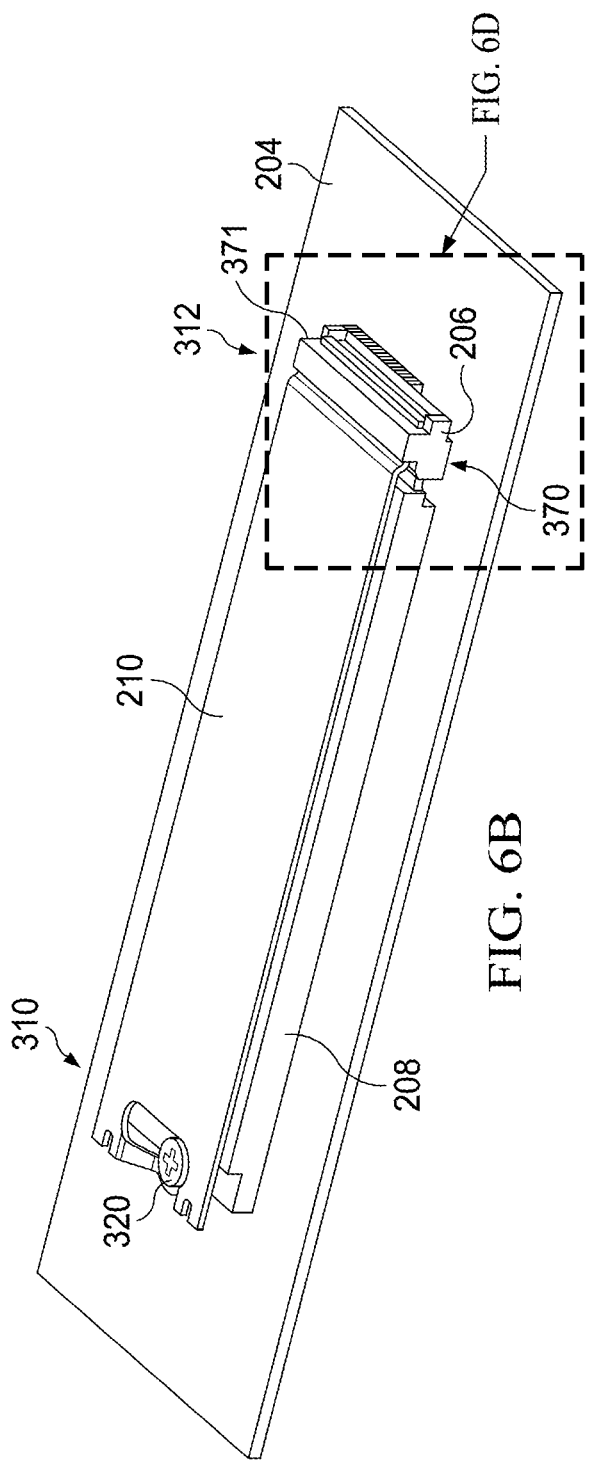
FIG. 6B illustrates a perspective view of the cooling system components in an assembled state, in the second implementation.
Figure 6C:
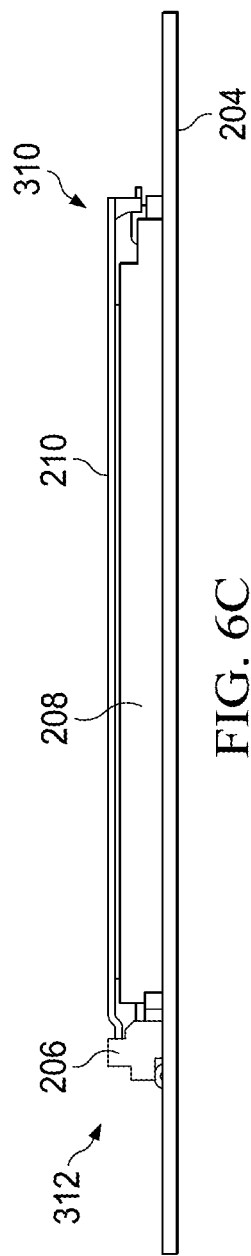
FIG. 6C illustrates a side view of the cooling system components in an assembled state, in the second implementation.
Figure 6D:
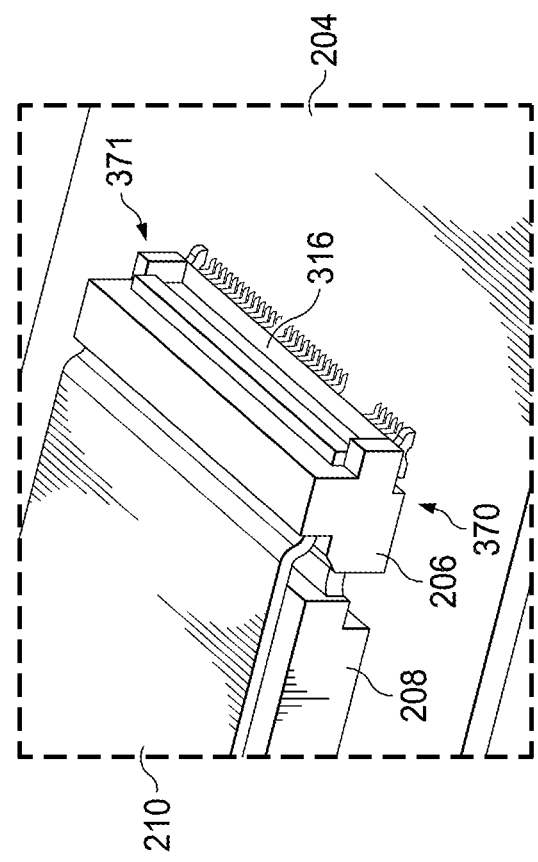
FIG. 6D illustrates a detailed view of the mating features between components of FIG. 6B in an assembled state, in the first implementation, in the second implementation.
Figure 8A:
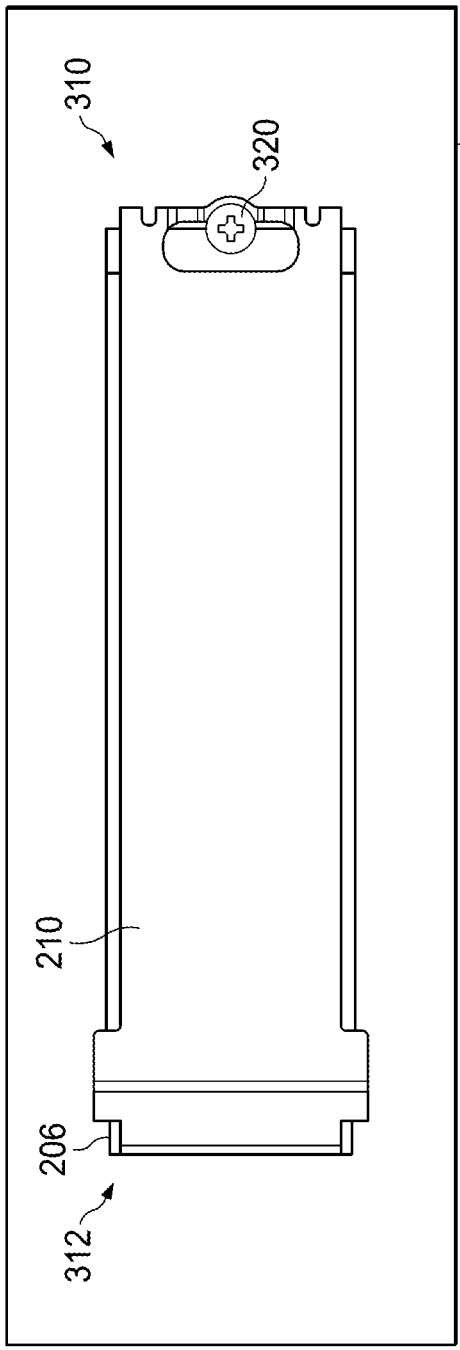
FIG. 8A illustrates a top down view of the cooling system components in an assembled state, in the third implementation.
Figure 8B:
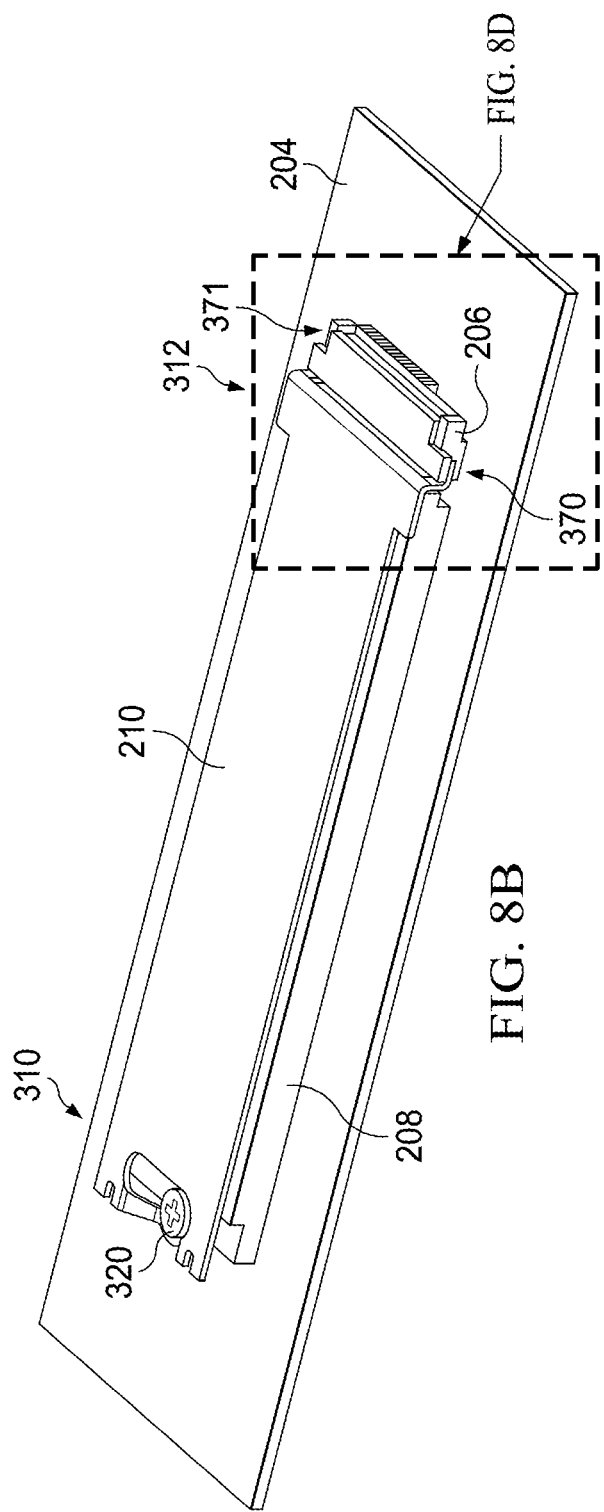
FIG. 8B illustrates a perspective view of the cooling system components in an assembled state, in the third implementation.
Figure 8C:
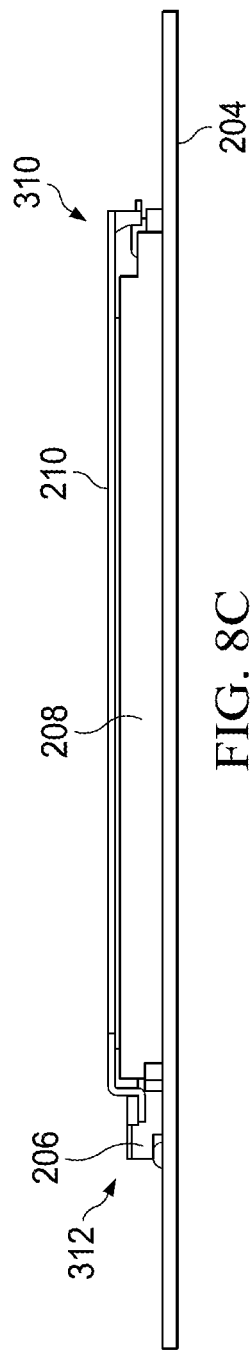
FIG. 8C illustrates a side view of the cooling system components in an assembled state, in the third implementation.
Figure 8D:
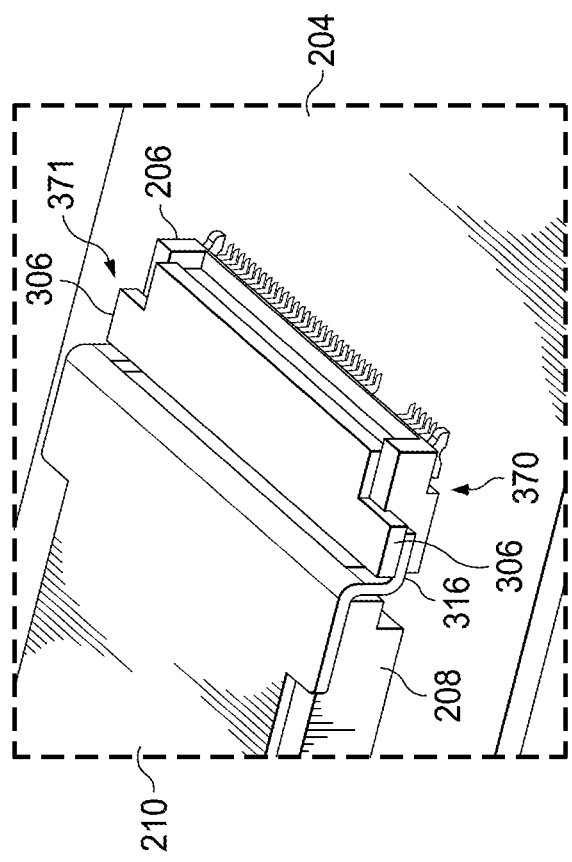
FIG. 8D illustrates a detailed view of the mating features between components of FIG. 8B in an assembled state, in the first implementation, in the third implementation.

Referring to FIGS. 5A, 5B, in a second implementation, the first mating features 306 of the computing card connector 206 can be positioned between the first end 302 and the second end 304 the computing card connector 206. In the example of FIGS. 5 and 6, the first mating features 306 of the computing card connector 206 can include a mounting slot (or multiple mounting slots). In some examples, the mounting slot can extend the width of the computing card connector 206 between the first side 370 and the second side 371 of the computing card connector 206. In some examples, the mounting slot can extend a portion of the length of the computing card connector 206 between the first side 370 and the second side 371 of the computing card connector 206. In some examples, the computing card connector 206 can include multiple mounting slots. In some examples, each of the mounting slots of the first mating features 306 can have differing depths. The mounting slot can be positioned toward the first end 304 of the computing card connector 206 and away from the second end 302 of the computing card connector 206.

The second mating features 306 of the thermal plate 210 can include a tabbed feature (or multiple tabbed features). In some examples, the tabbed feature can extend between the first side 372 and the second side 373 of the thermal plate 210. In some examples, the tabbed feature can extend a portion of the length of the thermal plate 210 between the first side 372 and the second side 373 of the thermal plate 210. In some examples, the thermal plate 210 can include multiple tabbed features. In some examples, the tabbed features can be positioned along any portion of the second end 312 of the thermal plate 210.

Thus, when second mating features 316 of the thermal plate 210 are mated with the first mating features 306 of the computing card connector 206, the tabbed feature of the thermal plate 210 is inserted into the mounting slot of the computing card connector 206. In some examples, the positioning of the second mating features 316 of the thermal plate 210 are aligned with the first mating features 306 of the computing card connector 206 when the second mating features 316 of the thermal plate 210 are mated with the first mating features 306 of the computing card connector 206. In some examples, the depth of the mounting slot of the computing card connector 206 can match a depth of the tabbed feature of the thermal plate 210 such that the tabbed feature (or tabbed features) of the thermal plate 210 is "secure" or appropriately coupled with the mounting slot (or mounting slots) of the computing card connector 206.

Referring to FIGS. 7A, 7B, in a third implementation, the first mating features 306 of the computing card connector 206 can be positioned at the second end 304 the computing card connector 206. In the example of FIGS. 7 and 8, the first mating features 306 of the computing card connector 206 can include a mounting flange (or multiple mounting flanges). In some examples, the mounting flanges can be positioned at the first side 370 and the second side 371 of the computing card connector 206 and extend from the first side 370 and the second side 371 of the computing card connector 206. In some examples, the mounting flanges can extend between the first side 302 and the second side 304 of the computing card connector 206.

The second mating features 306 of the thermal plate 210 can include a toe-in bend feature (or multiple toe-in bend features). In some examples, the toe-in bend features are positioned along the first side 372 and the second side 373 of the thermal plate 210. In some examples, the toe-in bend features can be positioned along any portion of the second end 312 of the thermal plate 210. In some examples, the thermal plate 210 can include any number of toe-in bend features.

Thus, when second mating features 316 of the thermal plate 210 are mated with the first mating features 306 of the computing card connector 206, the toe-in bend feature of the thermal plate 210 is engaged with the mounting flange of the computing card connector 206. In some examples, the positioning of the second mating features 316 of the thermal plate 210 are aligned with the first mating features 306 of the computing card connector 206 when the second mating features 316 of the thermal plate 210 are mated with the first mating features 306 of the computing card connector 206.

Referring to FIGS. 3-8, in some further implementations, the first mating features 306 of the computing card connector 206 can include a ground pass feature for the thermal plate 210 when the thermal plate 210 is coupled to the computing card connector 206. That is, the first mating features 306 can provide a path to ground for the thermal plate 210, e.g., for EMI shielding. For example, the ground pass feature can include a ground pin.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A system for cooling of computing components of an information handling system, including:
   a printed circuit board (PCB);
   a computing card connector coupled to the PCB, the computing card connector including:
      a first end;
      a second end positioned opposite to the first end;
      a first side;
      a second side positioned opposite to the first side;
      a first mounting flange extending from the first side; and
      a second mounting flange extending from the second side;
   a computing card coupled to the computing card connector; and
   a thermal plate including:
      a first end;
      a second end positioned opposite to the first end;
      a first side;
      a second side positioned opposite to the first side;
      a first toe-in bend feature extending from the first side; and
      a second toe-in bend feature extending from the second side end, wherein the thermal plate is coupled to the computing card connector at the second end of the thermal plate such that the first toe-in bend feature of the thermal plate is engaged with the first mounting flange of the computing card connector, and the second toe-in bend feature of the thermal plate is engaged with the second mounting flange of the computing card connector.

2. The system of claim 1, wherein the computing card connector is a M.2 connector, and the computing card is a M.2 computing card.

3. The system of claim 1, wherein the thermal plate is coupled to the computing card and the PCB at the first end of the thermal plate.

4. The system of claim 1, wherein the computing card is coupled to the second end of the computing card connector.

5. The system of claim 1, wherein the first and the second mounting flange include a ground pass feature to provide a path to ground for the thermal plate when the thermal plate is coupled to the computing card connector.

6. An information handling system, comprising:
   a printed circuit board (PCB);
   a computing card connector coupled to the PCB, the computing card connector including:
      a first end;
      a second end positioned opposite to the first end;
      a first side;
      a second side positioned opposite to the first side;
      a first mounting flange extending from the first side; and
      a second mounting flange extending from the second side;
   a computing card coupled to the computing card connector; and
   a thermal plate including:
      a first end;
      a second end positioned opposite to the first end;
      a first side;
      a second side positioned opposite to the first side;
      a first toe-in bend feature extending from the first side; and
      a second toe-in bend feature extending from the second side, wherein the thermal plate is coupled to the computing card connector at the second end of the thermal plate such that the first toe-in bend feature of the thermal plate is engaged with the first mounting flange of the computing card connector, and the second toe-in bend feature of the thermal plate is engaged with the second mounting flange of the computing card connector.

7. The system of claim 1, wherein the computing card connector is a M.2 connector, and the computing card is a M.2 computing card.

8. The system of claim 1, wherein the thermal plate is coupled to the computing card and the PCB at the first end of the thermal plate.

9. The system of claim 1, wherein the computing card is coupled to the second end of the computing card connector.

* * * * *